(12) United States Patent
Zoll et al.

(10) Patent No.: US 10,014,308 B2
(45) Date of Patent: Jul. 3, 2018

(54) ELECTRONIC CHIP MANUFACTURING METHOD

(71) Applicant: STMicroelectronics (Crolles 2) SAS, Crolles (FR)

(72) Inventors: Stephane Zoll, Froges (FR); Philippe Garnier, Meylan (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 15/228,236

(22) Filed: Aug. 4, 2016

(65) Prior Publication Data
US 2017/0200730 A1    Jul. 13, 2017

(30) Foreign Application Priority Data
Jan. 12, 2016 (FR) ...................... 16 50225

(51) Int. Cl.
| | | |
|---|---|---|
| *H01L 27/105* | (2006.01) | |
| *H01L 27/11539* | (2017.01) | |
| *H01L 29/788* | (2006.01) | |
| *H01L 21/28* | (2006.01) | |
| *H01L 27/11521* | (2017.01) | |

(52) U.S. Cl.
CPC .. *H01L 27/11539* (2013.01); *H01L 21/28273* (2013.01); *H01L 21/28282* (2013.01); *H01L 27/11521* (2013.01); *H01L 29/7887* (2013.01)

(58) Field of Classification Search
CPC ............. H01L 21/82345; H01L 27/105; H01L 29/66825; H01L 21/82385; H01L 21/823857; H01L 21/823892; H01L 27/0928; H01L 21/76224; H01L 27/11524; H01L 27/11551; H01L 27/1157; H01L 29/792; H01L 29/42; H01L 27/11578; H01L 29/7851; H01L 21/28282; H01L 21/31155; H01L 27/11521; H01L 27/11526; H01L 27/11546;
(Continued)

(56) References Cited

U.S. PATENT DOCUMENTS

| | | | | |
|---|---|---|---|---|
| 5,635,416 A | * | 6/1997 | Chen ...................... | H01L 27/105 257/E21.68 |
| 2006/0099756 A1 | * | 5/2006 | Kwon ............... | H01L 21/82345 438/201 |

(Continued)

OTHER PUBLICATIONS

INPI Search Report and Written Opinion for FR 1650225 dated Sep. 22, 2016 (12 pages).

*Primary Examiner* — Mouloucoulaye Inoussa
(74) *Attorney, Agent, or Firm* — Crowe & Dunlevy

(57) ABSTRACT

Active areas of memory cells and active areas of transistors are delimited in an upper portion of a wafer. Floating gates are formed on active areas of the memory cells. A silicon oxide-nitride-oxide tri-layer is then deposited over the wafer and a protection layer is deposited over the silicon oxide-nitride-oxide tri-layer. Portions of the protection layer and tri-layer located over the active areas of transistors are removed. Dielectric layers are formed over the wafer and selectively removed from covering the non-removed portions of the protection layer and tri-layer. A memory cell gate is then formed over the non-removed portions of the protection layer and tri-layer and a transistor gate is then formed over the non-removed portions of the dielectric layers.

18 Claims, 3 Drawing Sheets

(58) Field of Classification Search
CPC ......... H01L 27/11568; H01L 29/42344; H01L 29/66833; G11C 16/0425
USPC ................ 257/315, 326, E21.422, E21.623, 257/E21.689, E27.081; 438/201, 400, 438/287, 257, 258, 275, 981
See application file for complete search history.

(56) References Cited

U.S. PATENT DOCUMENTS

| | | |
|---|---|---|
| 2007/0004140 A1 | 1/2007 | Jang et al. |
| 2009/0315099 A1 | 12/2009 | Park et al. |
| 2013/0334584 A1 | 12/2013 | Tang et al. |
| 2014/0374815 A1* | 12/2014 | Wu .................. H01L 27/11568 257/326 |

\* cited by examiner

ELECTRONIC CHIP MANUFACTURING METHOD

PRIORITY CLAIM

This application claims the priority benefit of French Application for Patent No. 1650225, filed on Jan. 12, 2016, the disclosure of which is hereby incorporated by reference in its entirety to the maximum extent allowable by law.

TECHNICAL FIELD

The present disclosure relates to the field of electronic chips, and more particularly to chips comprising both non-volatile memory cells and electronic circuits comprising transistors.

BACKGROUND

In a chip with an on-chip non-volatile memory, MOS transistors coexist with memory cells. The performance and the reliability of such components strongly depend on the characteristics of their gate dielectrics. However, methods used to form dielectrics optimized for transistors and dielectrics optimized for memory cells in a same chip raise different implementation issues. A method enabling to form, in a same chip, transistors and memory cells provided with optimized dielectrics is thus desired.

SUMMARY

Thus, an embodiment provides an electronic chip manufacturing method, comprising the steps of: a) delimiting active areas of memory cells and active areas of transistors in an upper portion of a wafer, and forming floating gates on active areas of memory cells; b) depositing a silicon oxide-nitride-oxide tri-layer; c) depositing a protection layer; d) removing the portions of the protection layer and of the tri-layer located on portions of said surface comprising the active areas of transistors; e) forming dielectric layers on the surface of the assembly; and f) removing the portions of said dielectric layers covering the non-removed portions of the protection layer.

According to an embodiment, step e) comprises the steps of: e1) forming a first silicon oxide layer on the surface of the assembly; and e2) forming a second layer of a material of high permittivity.

According to an embodiment, the second layer is a stack comprising a hafnium silicate layer topping a silicon oxynitride layer.

According to an embodiment, the second layer has a thickness in the range from 1.5 to 3 nm.

According to an embodiment, the active areas of transistors are active areas of first transistors and active areas of second transistors, further comprising, between steps e1) and e2), the steps of: removing the portions of the first silicon oxide layer covering active areas of the first transistors; and thermally oxidizing the entire surface to form an oxide layer in the upper portion of the active areas of the first transistors.

According to an embodiment, the method further comprises, between steps e) and f), a step of depositing a metal layer on the dielectric layers, followed by a step of removing portions of the metal layer located above non-removed portions of the protection layer.

According to an embodiment, the method comprises, after step f), a step of removing the rest of the protection layer.

According to an embodiment, the protection layer has a thickness in the range from 3 to 500 nm.

According to an embodiment, the protection layer is made of amorphous silicon.

According to an embodiment, the protection layer is made of polysilicon.

Another embodiment provides an electronic chip comprising: portions of a silicon oxide-nitride-oxide tri-layer, each being arranged on a floating gate of memory cells; and portions of a material of high permittivity, each of which is arranged on an active transistor area.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

Figure 1:
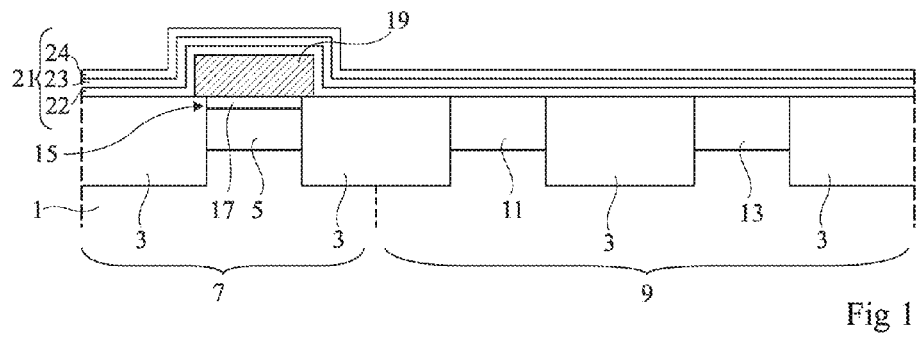
FIGS. 1 to 7 are simplified cross-section views illustrating steps of an example of a method of manufacturing a chip with an on-chip non-volatile memory.

The same elements have been designated with the same reference numerals in the different drawings and, further, the various drawings are not to scale. For clarity, only those elements which are useful to the understanding of the described embodiments have been shown and are detailed.

In the following description, when reference is made to terms qualifying the absolute position, such as terms "high", "low", etc., or the relative position, such as terms "above", "upper", etc., reference is made to the orientation of the concerned element in the drawings.

FIGS. 1 to 7 are simplified cross-section views illustrating steps of an embodiment of a method of manufacturing a chip with an on-chip non-volatile memory. The chip comprises non-volatile memory cells, transistors called low-voltage transistors, and transistors called medium-voltage transistors, having an operating voltage higher than that of low-voltage transistors. For simplification, the forming of a single memory cell, of a single low-voltage transistor, and of a single medium-voltage transistor is illustrated.

At the step illustrated in FIG. 1, active areas have been delimited in the upper portion of a semiconductor layer 1 by insulating trenches 3. The active areas include active memory cell areas 5 located in portions 7 of wafer 1. Portions 9 of wafer 1 contain active areas 11 of medium-voltage transistors and active areas 13 of low-voltage transistors. The various active areas are doped in selected fashion. As an example, the wafer is of silicon-on-insulator type (SOI), that is, comprising a thin upper semiconductor layer on an insulating layer covering a substrate. The active areas may then be formed in the upper layer.

A floating gate 15 is formed on each active memory cell area 5. Each floating gate 15 comprises a conductive region 19 topping a portion of dielectric layer 17 covering the active area. Conductive region 19 may be made of doped polysilicon.

A silicon oxide-nitride-oxide 21 or ONO tri-layer, that is, the stacking of a silicon oxide layer 22, of a silicon nitride layer 23, and of an upper silicon oxide layer 24, covers the upper surface of the assembly. As an example, silicon oxide layer 22 has a thickness in the range from 2 to 5 nm. Silicon nitride layer 23 may have a thickness in the range from 4 to 7 nm. Silicon oxide layer 24 may have a thickness in the range from 2 to 6 nm. Tri-layer 21 is intended to form the inter-gate insulator of the memory cell.

Figure 2:
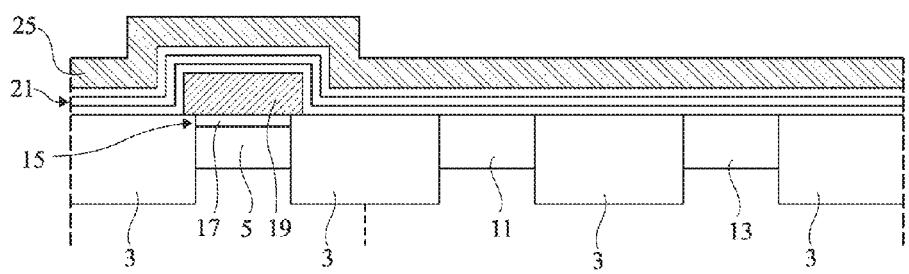

At the step shown in FIG. 2, a silicon protection layer 25 is deposited on tri-layer 21. As an example, protection layer 25 is made of amorphous silicon. In this case, the thickness of protection layer 25 may be in the range from 3 to 500 nm. As a variation, protection layer 25 is made of polysilicon. In this case, the thickness of protection layer 25 may be in the range from 3 to 500 nm.

Figure 3:
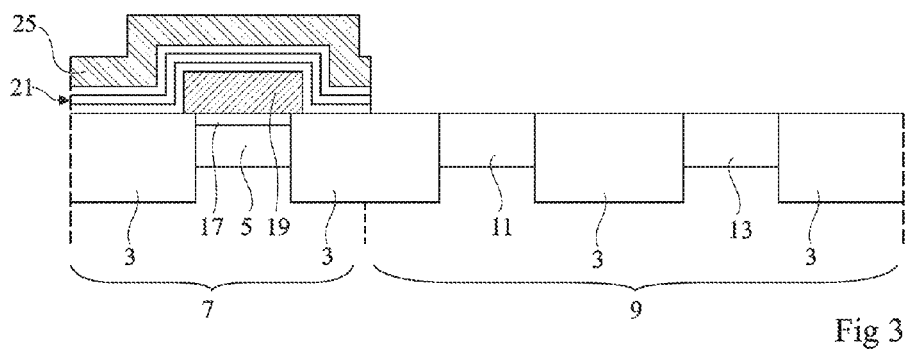

At the step shown in FIG. 3, the portions of tri-layer 21 and of the protection layer located in portions 9 containing active areas 11 and 13 of transistors are removed. To achieve this, a mask may be formed by lithography on portions 7. The portions of protection layer 25 located above portions 9 may be plasma-etched, or may also be wet-etched in ammonia and hydrofluoric acid solutions. The portions of tri-layer 21 located on portions 9 may then be wet-etched in a hydrofluoric acid solution or by combination of a wet etching and of a plasma etching.

It should be noted that at the step of FIG. 3, the portions of tri-layer 21 located on portions 7, containing the active areas of memory cells, are protected by protection layer 25.

Figure 4:
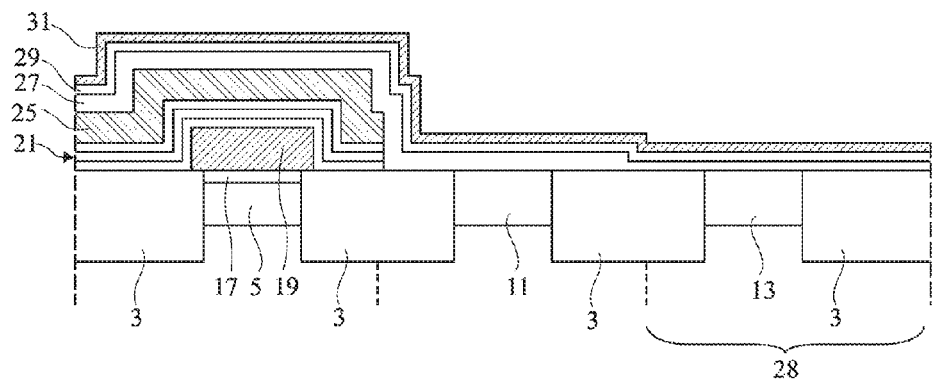

At the step shown in FIG. 4, a dielectric layer 27 is formed on the upper surface of the assembly. The thickness of dielectric layer 27 is smaller on the active areas of low-voltage transistors than on the active areas of medium-voltage transistors. As an example, the thickness of layer 27 on the active areas of low-voltage transistors is in the range from 1 to 1.5 nm. The thickness of layer 27 located on the active areas of medium-voltage transistors may be in the range from 3 to 5 nm.

As an example, layer 27 is formed by the steps of:
depositing a first silicon oxide layer over the surface of the assembly, or thermally oxidizing the surface of the assembly;
etching the portions of this first layer located on a portion 28 of the wafer containing the low-voltage transistors, for example, with a hydrofluoric acid solution; and
forming in portion 28 a second oxide layer thinner than the first layer, for example, by thermal oxidation.

As a variation, the first silicon oxide layer may be nitrided before the etch step. In another variation, the etch step may at the same time remove the portions of the first oxide layer located on the remains of protection layer 25.

A dielectric layer 29 is then deposited on the surface of the assembly. As an example, dielectric layer 29 is a stack comprising a layer of a material said to be of high permittivity made of hafnium silicate (HfSiON), nitrided or not, topping a layer of silicon oxynitride (SiON), which stack has a permittivity greater than the permittivity of silicon oxide. The stack forming dielectric layer 29 may have a thickness in the range from 1.5 to 3 nm.

A metal layer 31 is then deposited over the surface of the assembly. As an example, metal layer 31 is made of titanium nitride TiN and may also comprise other elements such as lanthanum or aluminum. The thickness of the layer may be in the range from 3 to 10 nm.

Due to the protection provided by protection layer 25, the tri-layer 21 remaining in place above the active areas of memory cells is in contact with none of dielectric or metal layers 27, 29, or 31.

Figure 5:
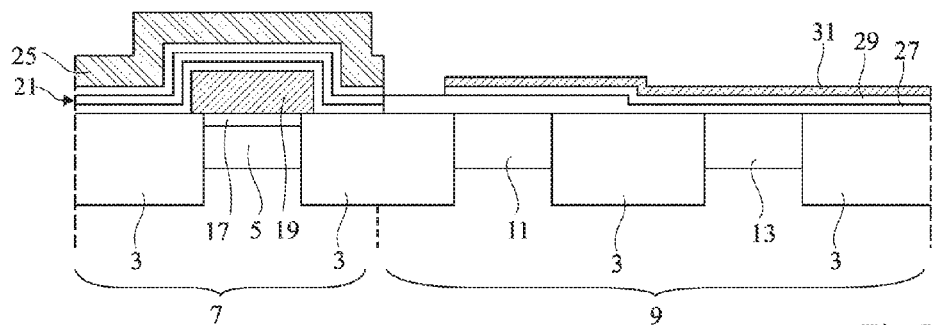

At the step shown in FIG. 5, the portions of layers 27, 29, and 31 located on the remaining portions of protection layer 25 are removed. As an example, this step is carried out by wet etching after the masking of portions 9 of the wafer. Metal layer 31 may be etched by a heated aqueous solution of ammonia and of hydrogen peroxide. Metal layer 31 may also be etched by a hydrogen peroxide and hydrochloric or sulfuric acid solution. Dielectric layers 27 and 29 may be etched by a hydrofluoric acid solution.

Figure 6:
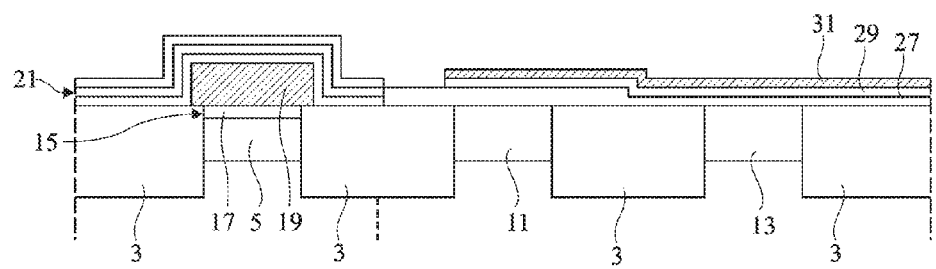

At the step illustrated in FIG. 6, the remaining portions of protection layer 25 are removed. As an example, this step may be carried out by wet etching with the same mask as at the step of FIG. 5. When layer 25 is made of amorphous silicon, it may be removed by a step of etching with a solution of ammonia, and this step may be followed by a step of etching with a hydrofluoric acid solution.

The etching of the polysilicon or amorphous silicon is effectively selective over the upper silicon oxide layer of tri-layer 21. Thereby, the protection layer may be removed without damaging the ONO tri-layer or modifying the properties thereof.

Figure 7:
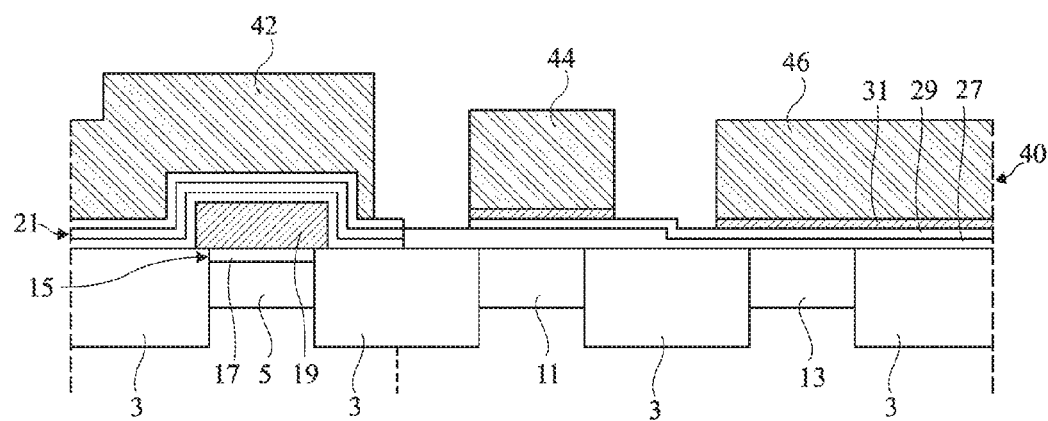

At the step illustrated in FIG. 7, a conductive layer 40, for example, made of doped polysilicon, is deposited over the surface of the assembly. As an example, the thickness of polysilicon layer 40 may be in the range from 40 to 100 nm. Portions of layer 40 and portions of layer 31 are etched to electrically insulate portions of layer 40 above the active areas. Portions 42 are located above active memory cell areas 5, portions 44 are located above active areas 11 of medium-voltage transistors, and portions 46 are located above active areas 13 of low-voltage transistors.

The obtained structure comprises on each active memory cell area 5, from bottom to top:
a floating gate 15 comprising a conductive region 19 on a dielectric layer portion 17;
a portion of dielectric tri-layer 21 forming an inter-gate dielectric; and
a portion 42 which forms the control gate of the memory cell.

Each active transistor area 11 or 13 supports a gate stack comprising, from bottom to top:
a dielectric layer portion 27, thicker for medium-voltage transistors than for low-voltage transistors;
a portion of layer of a dielectric material 29 of high permittivity; and
a conductive gate comprising a portion of metal layer 31 and a portion of polysilicon layer 44 or 46.

According to an advantage, the portions of tri-layer 21 of the obtained memory cells have not been in contact with metallic materials or with the dielectric material of layer 29. No material has been able to alter the properties of the tri-layer and in particular of its upper layer. Further, the portions of tri-layer 21 of the memory cells have not been in contact with oxygen during thermal oxidation phases. Further, due to the selectivity of the etching of the protection layer, the thickness of the upper layer of the tri-layer is not modified during the process. Thereby, the dielectric tri-layer of the formed memory cells keeps all the characteristics, such as the thickness or the composition, of tri-layer 21 deposited at the step illustrated in FIG. 1.

Further, in the transistors, characteristics such as the thickness or the composition of dielectric and metal layers 27 and 29 and 31 are determined independently from the characteristics of tri-layer 21 of the memory cells. In particular, transistors having their gate dielectrics comprising materials of high permittivity may be formed next to the memory cells.

The method thus advantageously enables to form in a same chip gate dielectrics of transistors and dielectrics of separation between memory cell gates, while controlling in particularly reliable fashion the characteristics of such dielectrics, which improves their performance.

Specific embodiments have been described. Various alterations, modifications, and improvements will occur to those skilled in the art. In particular, in the above-described embodiments, memory cells comprising ONO tri-layer portions are manufactured inside and on top of portions 7 of the wafer and transistors are formed inside and on top of portions 9. Embodiments are possible where portions of the ONO tri-layer are used in transistors formed inside and on top of portions 7, for example, transistors having a higher voltage than medium-voltage transistors.

Further, although low-voltage and medium-voltage transistors manufactured in the above-described embodiments comprise a specific stack of portions of dielectric and metal layers 27, 29, and 31 under conductive layer 40, other stacks are possible. In particular, metal layer 31 may be omitted.

Further, in the above-described embodiments, a step of removing the remains of protection layer 25 is provided and illustrated in FIG. 6. The protection layer may be made of doped polysilicon, like conductive layer 40, and in this case the step illustrated in FIG. 6 may be omitted. At the step illustrated in FIG. 7, protection layer 25 then becomes an integral part of conductive layer 40. The remains of protection layer 25 are kept, and thus the tri-layer is not modified during the process.

Further, in the described embodiment, the wafer inside and on top of which the transistors and the memory cells are formed is of SOI type. Other embodiments are possible, where the wafer is made of a solid semiconductor material. In the case where the wafer is of SOI type, the insulator layer and the thin upper layer may be removed at certain locations to form therein, for example, memory cells on solid silicon.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. An electronic chip manufacturing method, comprising the steps of:
   a) delimiting a first active area for a memory cell and a second active area for transistors in a wafer;
   b) forming a floating gate on the first active area for the memory cell;
   c) depositing a silicon oxide-nitride-oxide tri-layer on the wafer;
   d) depositing a protection layer on the wafer;
   e) removing a portions of the protection layer and a portion of the tri-layer located on a portion of the wafer where the second active area is located;
   f) forming dielectric layers on the wafer;
   g) removing a portion of said dielectric layers which covers a non-removed portion of the protection layer; and
   h) removing a remainder of the protection layer.

2. The method of claim 1, wherein step f) comprises the steps of:
   f1) forming a first silicon oxide layer over the wafer; and
   f2) forming a second layer of a material of high permittivity.

3. The method of claim 2, wherein the second layer is a stack of layers comprising a hafnium silicate layer over a silicon oxynitride layer.

4. The method of claim 2, wherein the second layer has a thickness in a range from 1.5 to 3 nm.

5. The method of claim 2, wherein said second active area comprises a first sub-active area for first transistors and a second sub-active area for second transistors, further comprising, between steps f1) and f2), the steps of:
   removing portions of the first silicon oxide layer covering the first sub-active area for the first transistors; and
   thermally oxidizing a surface to form an oxide layer in an upper portion of the first sub-active areas for the first transistors.

6. The method of claim 1, further comprising, between steps f) and g), a step of depositing a metal layer on the dielectric layers, followed by a step of removing portions of the metal layer located above non-removed portions of the protection layer.

7. The method of claim 1, wherein the protection layer has a thickness in a range from 3 to 500 nm.

8. The method of claim 1, wherein the protection layer is made of amorphous silicon.

9. The method of claim 1, wherein the protection layer is made of polysilicon.

10. A method, comprising the following steps performed in sequence:
    delimiting a first active area and a second active area of a substrate;
    forming a floating gate electrode over the first active area;
    depositing a silicon oxide-nitride-oxide tri-layer over the floating gate electrode and over the second active area;
    depositing a protection layer over the silicon oxide-nitride-oxide tri-layer;
    removing the protection layer and silicon oxide-nitride-oxide tri-layer from over the second active area;
    forming one or more dielectric layers over a remaining portion of the protection layer and over the second active area;
    removing the one or more dielectric layers from over the remaining portion of the protection layer;
    removing the remaining portion of the protection layer;
    forming a first gate electrode over a remaining portion of the silicon oxide-nitride-oxide tri-layer and the floating gate electrode; and
    forming a second gate electrode over the remaining portion of the one or more dielectric layers and the second active area.

11. The method of claim 10, wherein forming one or more dielectric layers comprises:
    forming a silicon oxide layer; and
    forming a layer of a material of high permittivity on said silicon oxide layer.

12. The method of claim 11, wherein the layer of the material of high permittivity is a stack of layers comprising a hafnium silicate layer over a silicon oxynitride layer.

13. The method of claim 11, wherein the layer of the material of high permittivity has a thickness in a range from 1.5 to 3 nm.

14. The method of claim 10, wherein forming one or more dielectric layers comprises:
    thermally oxidizing a surface of the second active area of the substrate to form an oxide layer; and
    forming a layer of a material of high permittivity on said silicon oxide layer.

15. The method of claim 14, wherein the layer of the material of high permittivity is a stack of layers comprising a hafnium silicate layer over a silicon oxynitride layer.

16. The method of claim 14, wherein the layer of the material of high permittivity has a thickness in a range from 1.5 to 3 nm.

17. The method of claim 10, wherein the protection layer is made of amorphous silicon.

18. The method of claim 10, wherein the protection layer is made of polysilicon.

* * * * *